United States Patent
Lou

(10) Patent No.: US 6,171,956 B1
(45) Date of Patent: Jan. 9, 2001

(54) METHOD FOR IMPROVING THE THERMAL CONDUCTIVITY OF METAL LINES IN INTEGRATED CIRCUITS

(75) Inventor: Chine-Gie Lou, Hsinchu Hsien (TW)

(73) Assignee: Worldwide Semiconductor Manufacturing Corp., Hsinchu (TW)

( * ) Notice: Under 35 U.S.C. 154(b), the term of this patent shall be extended for 0 days.

(21) Appl. No.: 09/391,496

(22) Filed: Sep. 8, 1999

(30) Foreign Application Priority Data

Aug. 10, 1999 (TW) .................................................. 88113684

(51) Int. Cl.[7] .......................... H01L 21/44; H01L 21/473; B44C 1/22; C23F 15/00
(52) U.S. Cl. .......................... 438/665; 438/618; 438/666; 438/964; 216/75; 216/77; 216/78; 148/DIG. 105; 148/DIG. 106
(58) Field of Search ..................................... 438/665, 668, 438/666, 964, 597, 618, 393; 148/DIG. 104, DIG. 105, DIG. 106; 216/74, 75, 77, 78, 96, 100, 102, 105

(56) References Cited

U.S. PATENT DOCUMENTS 5,240,558 * 8/1993 Kawasaki et al. .................... 438/396

* cited by examiner

*Primary Examiner*—Charles Bowers
*Assistant Examiner*—Thanhha Pham

(57) ABSTRACT

The method includes forming a metal layer over a substrate. Subsequently, a discrete dot masking is deposited on the surface of the metal layer. A discrete rugged polysilicon or hemispherical grained silicon (HSG-Si) can be chosen as the discrete dot masking. The source gas used to form the discrete rugged polysilicon includes $Si_2H_6$ at a temperature of about 400 to 450° C. An anisotropically etching step is performed to etch the metal layer by using the discrete dot masking as an etching mask, thereby forming a surface pattern formed thereon. Then, the discrete dot masking is removed. The metal layer is patterned to a conductive line pattern. An organic material layer with low dielectric constant is formed on the patterned metal layer. A silicon oxide layer is successively formed on the organic material layer, followed by polishing the silicon oxide layer using a chemical mechanical polishing (CMP).

8 Claims, 1 Drawing Sheet

METHOD FOR IMPROVING THE THERMAL CONDUCTIVITY OF METAL LINES IN INTEGRATED CIRCUITS

FIELD OF THE INVENTION

The present invention relates to a process for manufacturing integrated circuits and, more specifically, to a metallization process for manufacturing a semiconductor device.

BACKGROUND OF THE INVENTION

Great progress has been made in ULSI technology and it has been a trend to increase the packaging density of devices. With this reduction of device size, many challenges arise in the manufacture of the ICs. Further, a various of specific requirements have been demanded to meet the such requirement. The large integration of semiconductor ICs has been accomplished by a reduction in individual device size. The formation of the ICs includes the fabrication of the wafer, the manufacture of the circuits and the package of the circuits. A so-called metallization involves the establishment of the connection between conductive structures. The purpose of the metallization includes constructing the connection between each terminal of the devices and connecting each device to perform a desired function. The typical material used for the metallization includes AlSiCu alloy and tungsten. The former exhibits superior conductive characteristic and the later is used for higher temperature process. The other material for semiconductor also includes tungsten silicide, titanium silicide and titanium nitride, etc.

Conductive structures between semiconductor devices are becoming more critical as the integrated circuits approaches to ever smaller submicron spectrums. A conductive path is formed by the interconnections between the devices, and effectively provides electrical connections between them. Interconnections between devices are typically constructed after the devices are formed on a semiconductor wafer. The isolated devices are interconnected through specific conducting paths to construct some desired function in an electrical circuit. At present, different interconnection technologies have been proposed and applied to the fabrication of integrated circuits. Furthermore, conductive metal plug technique is primly used in multi-level interconnection in VLSI and ULSI designs. In prior art, a metal layer is formed over a thick oxide layer, followed by etching the metal layer to a desired metal pattern by conventional lithography and etching technologies. A liner layer typical formed on the surface of the metal pattern to improve the adhension for subsequent layer. In general, the liner layer is composed of oxide. A spin on glass is then coated on the liner layer as an inter metal dielectric (IMD) layer. After that a further silicon oxide layer is deposited on the surface of the spin on glass, then a global planarization is performed to achieve better topography by chemical mechanical polishing (CMP). Subsequently, a via hole is opened through the IMD to the underlying metal pattern layer. A tungsten plug is successively formed in the via hole to complete the formation of the metalization.

One of the problems associated with the formation of metal connection is the parasitic capacitor. The design rule shrinkage of ULSI has led to increase interconnection delay caused by the parasitic capacitance of wiring. To reduce the RC time delay, one of the ways is to reduce the dielectric constant of inter metal dielectric layer. The capability of thermal dispersal is a further major consideration for the interconnection. At present, the organic material is widely used for IMD due to the organic material has lower dielectric constant, therefore, it can reduce the RC time delay, effectively. However, the thermal conductivity of the organic material is poor, this leads to the thermal spreading efficient of the metal line is also bad. Thus, the reliability of the devices is degraded.

SUMMARY OF THE INVENTION

An object of the present invention is to provide a metal line with rugged surface to enhance the capability of thermal dispersal. A further object of the present invention is to introduce an organic material with lower dielectric constant to act as the inter metal dielectric for reducing the parasitic capacitance.

A metal layer is formed over a substrate. The metal layer can be chosen from aluminum, tungsten, titanium, AlCu, AlSiCu or other similar material. Subsequently, a discrete rugged polysilicon is formed on the metal layer as an etching mask. The source gas used to form the discrete rugged polysilicon includes $Si_2H_6$ at a temperature of about 400 to 450° C. An anisotropically etching step is performed to etch the metal layer to a depth into therein by using the discrete rugged polysilicon as an etching mask, thereby forming a surface pattern on the surface of the metal layer. Then, the discrete rugged polysilicon is removed by etching. The metal layer is patterned to a desired metal line pattern by a conventional lithography and etching processes. The next step is to form an organic material, such as flare, with low dielectric constant on the patterned metal layer. The flare layer can be directly deposited on the metal layer. A silicon oxide layer is formed on the flare layer, followed by polishing the silicon oxide layer using a chemical mechanical polishing (CMP).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The design rule shrinkage of ULSI has led to increase interconnection delay caused by the parasitic capacitance of wiring. To reduce the RC time delay, one of the ways is to reduce the dielectric constant of inter metal dielectric layer. A great deal of work has been aimed at developing organic material for used as inter metal dielectric (IMD) layer because the organic material exhibits the characteristic of lower dielectric constant than the one of inorganic material. However, the poor thermal conductivity for organic material has hindered their widespread use in microelectronics. The present invention improves the thermal dispersal of the metal lines by a rugged surface formed thereon. A further key feature of the method is the formation of rugged polysilicon archipelago on a metal layer and its transference to the underlying metal layer. As will be seen below, these techniques can be used for improving the performance of a conducting structure.

Figure 1:
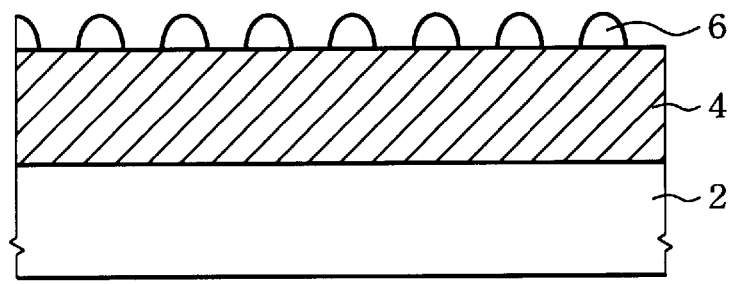
FIG. 1 is a cross sectional view of a semiconductor wafer illustrating the steps of forming a metal line and a discrete rugged polysilicon over a substrate in accordance with the present invention.

Referring to FIG. 1, in the preferred embodiment, a substrate 2 is a p or n type silicon with (100) crystallographic orientation. An isolation structure (not shown), such as thick field oxide region or shallow trench isolation, is created for the purpose of isolation. A semiconductor device (not shown), such as a MOS transistor, is formed on the substrate 2. An isolation layer may be covered the device. Those are not the key points of the method, therefore a detailed description will not be given.

A metal layer 4 is successively formed over the substrate 2. The metal layer 4 can be chosen from aluminum, tungsten, titanium, copper, AlCu, AlCuSi or other similar material. The thickness of the metal layer 4 is about 3000 to 7000 angstroms. Subsequently, a discrete dot masking 6 is deposited on the surface of the metal layer 4. The spacing between the discrete dot masking is about 200 to 2000 angstroms. The grain size of the dot masking is about 300 to 1000 angstroms. For example, a discrete rugged polysilicon can be formed on the metal layer 4 as an etching mask. The source gas used to form the discrete rugged polysilicon includes $Si_2H_6$ at a temperature of about 0° to 450° C. Alternatively, hemispherical grained silicon (HSG-Si) can also be used in lieu of the rugged polysilicon.

Figure 2:
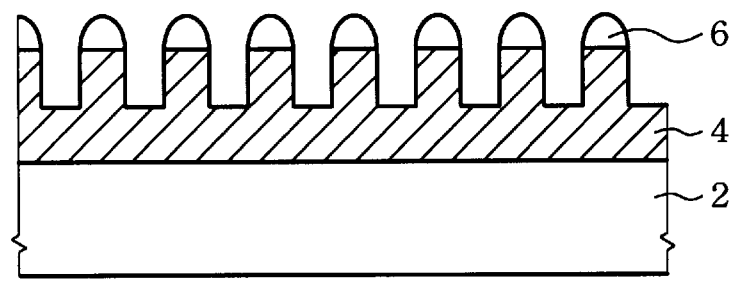
FIG. 2 is a cross sectional view of a semiconductor wafer illustrating the step of performing an etching by using the discrete rugged polysilicon as a mask in accordance with the present invention.

Turning to FIG. 2, an anisotropic etching step is performed to etch the metal layer 4 to a depth into therein by using the discrete dot masking 6 as an etching mask, thereby forming a surface pattern formed on the surface of the metal layer 4. The extra surface pattern of the metal layer 4 increases the surface area to improve the capability of thermal dispersal. In an embodiment, the etching includes reactive ion etching having $BCl_3$ as the gas source. Then, reactive ion etching stripes the discrete dot masking 6. The reaction gas includes HBr.

Figure 3:
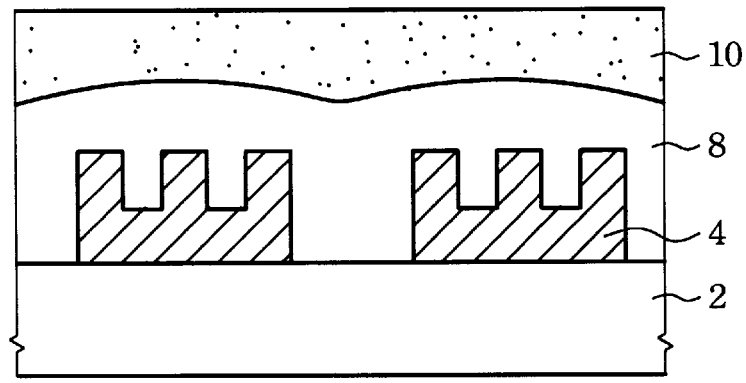
FIG. 3 is a cross sectional view of a semiconductor wafer illustrating the steps of forming an organic layer and an oxide layer over the substrate in accordance with the present invention.

Turning to FIG. 3, the metal layer 4 is patterned to a desired conductive line pattern by a conventional lithography and etching processes. The next step is to form an organic material 8 with low dielectric constant on the patterned metal layer 4 to act as the IMD. For example, a flare layer 8 can be used to play the role of the IMD, which has low dielectric constant to reduce the parasitic capacitance issue, thereby improving the RC time delay. The flare layer 8 can be formed by spin on glass technique, and one of the flares is made by "Allied Signal" company. Another feature of the flare layer 8 is that it can be directly deposited on the metal layer 4 by omitting the liner layer.

Finally, a silicon oxide layer 10 is formed on the flare layer 8. In an embodiment, the silicon oxide layer 10 is formed by using a low temperature CVD, such as plasma enhanced CVD using silane as a precursor. Alternatively, the silicon oxide layer 10 may be formed using other known oxide chemical compositions and procedures. For example, the silicon oxide layer 10 can be formed using a chemical vapor deposition process, with a tetraethylorthosilicate (TEOS) source, at a temperature between about 300 to 450 degrees centigrad.

Next, a planarization step is used to achieve a better topography. In general, a chemical mechanical polishing can be used to obtain the purpose.

The conductive structure according to the present invention includes a conductive pattern 4 having a surface pattern formed thereon to increase the surface area. An organic material layer 8 with low dielectric constant is successively formed on the conductive pattern 4 to reduce the parasitic capacitance. An oxide layer 10 is formed on the organic material layer 8. The present invention effectively solves both the thermal dispersal and RC time delay problems.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a conducting structure over a substrate, said method comprising the following steps of:
   forming a metal layer over said substrate;
   forming a discrete dot masking on said metal layer;
   etching said metal layer to a depth by using said discrete dot masking as an etching mask, thereby forming a surface pattern formed thereon to increase the surface area of said metal layer;
   removing said discrete dot masking;
   patterning said metal layer to form a conductive pattern; and
   forming an organic material layer on said conductive pattern.

2. The method of claim 1, further comprising following steps after forming said organic material layer:
   forming an oxide layer on said organic material layer; and
   performing a planarization to said oxide layer.

3. The method of claim 1, wherein said discrete dot masking comprises a discrete rugged polysilicon.

4. The method of claim 3, wherein said discrete rugged polysilicon is formed with a gas including $Si_2H_6$.

5. The method of claim 3, wherein said discrete rugged polysilicon is formed at a temperature of about 400 to 450° C.

6. The method of claim 1, wherein said discrete dot masking comprises a discrete hemispherical grained silicon.

7. The method of claim 1, wherein said discrete dot masking is removed by reactive ion etching (RIE).

8. The method of claim 1, wherein said organic material layer comprises a flare layer.

* * * * *